United States Patent [19]

Plummer

[11] 4,228,402

[45] Oct. 14, 1980

[54] DEVICE FOR REMOTE CONTROL OF STEREO HI-FI AMPLIFIER PARAMETERS

[75] Inventor: Jan P. Plummer, Atlanta, Ga.

[73] Assignee: Sound-Mate Inc., Atlanta, Ga.

[21] Appl. No.: 945,019

[22] Filed: Sep. 22, 1978

[51] Int. Cl.² ............................................. H04B 1/00
[52] U.S. Cl. ............................. 179/1 VL; 340/171 R
[58] Field of Search ................... 325/36, 37, 389, 390, 325/392, 393, 394; 343/225, 228; 358/194; 340/147 R, 167 R, 167 A, 168 R, 168 B, 310 R, 310 A, 171 R, 171 PF; 179/1 D, 100.1 TC

[56] References Cited

U.S. PATENT DOCUMENTS

| 3,168,738 | 2/1965 | Curll | 325/37 |
| 3,268,817 | 8/1966 | Hagey | 325/37 |
| 3,835,454 | 10/1974 | Palmieri et al. | 325/37 |
| 3,987,414 | 10/1976 | Tuma | 340/171 R |

Primary Examiner—John H. Wolff
Assistant Examiner—Joseph A. Popek

[57] ABSTRACT

A remote control system for an audio system component. An intermediate circuit is connected into the audio system interposed between the component and system amplifier through standard input/output jacks. The intermediate circuits include a first controllable attenuator for volume control, and frequency selective controllable attenuators to provide for independent bass and treble control. Control of the attenuators are effected from a remotely located control panel. Provisions for coupling the control panel and intermediate circuit through existing standard house electrical wiring, and provisions for remote on/off control are also described.

17 Claims, 8 Drawing Figures

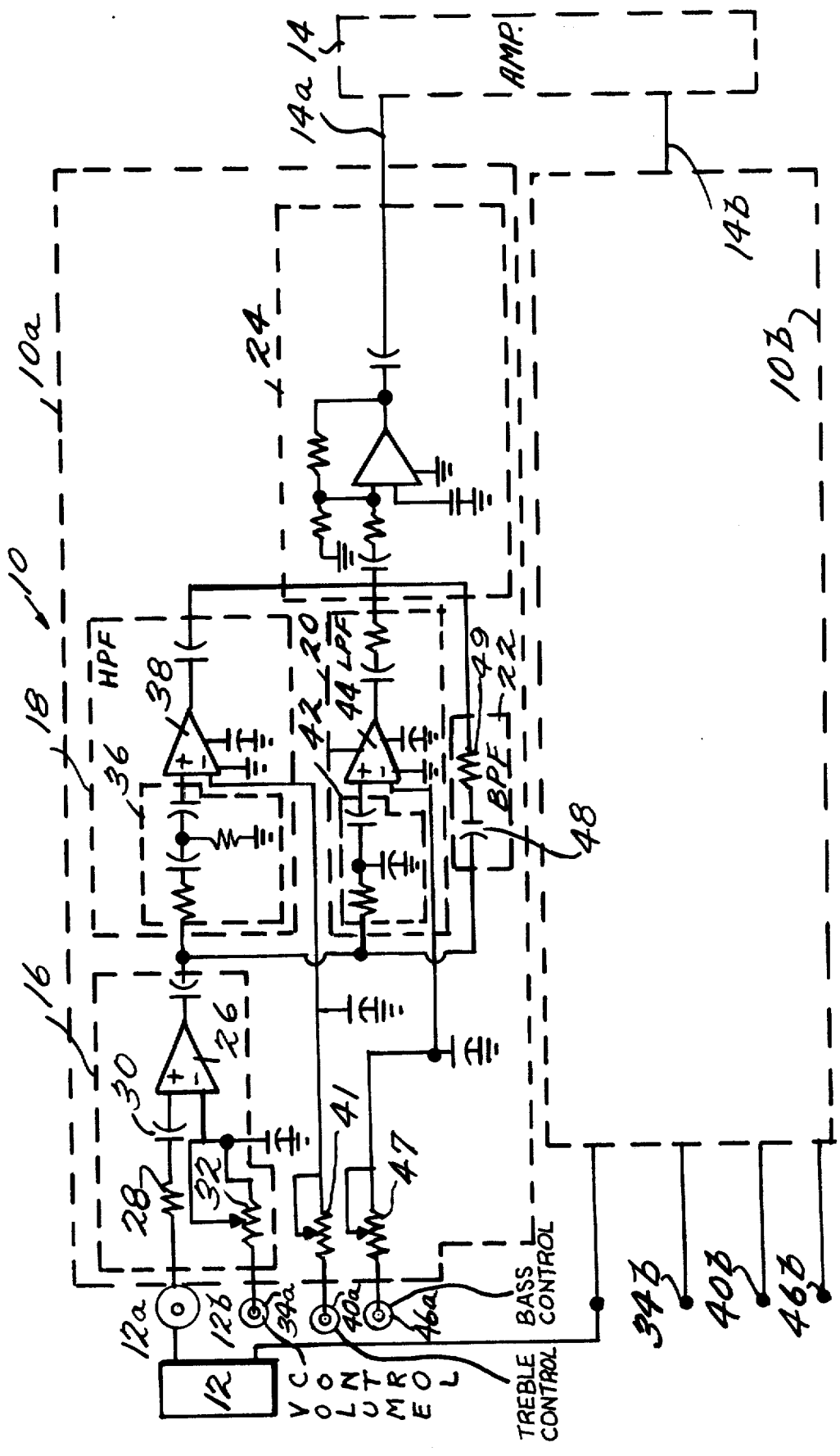

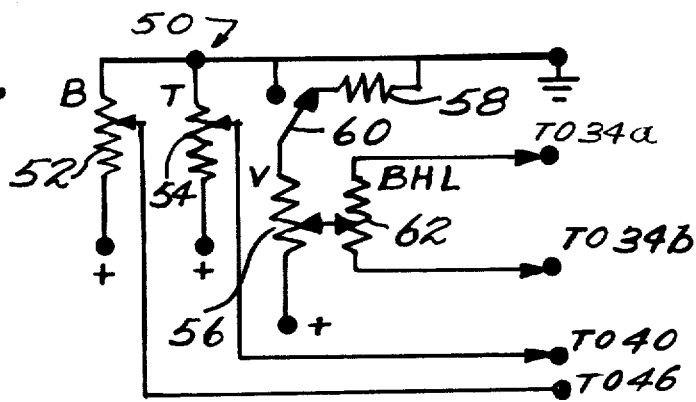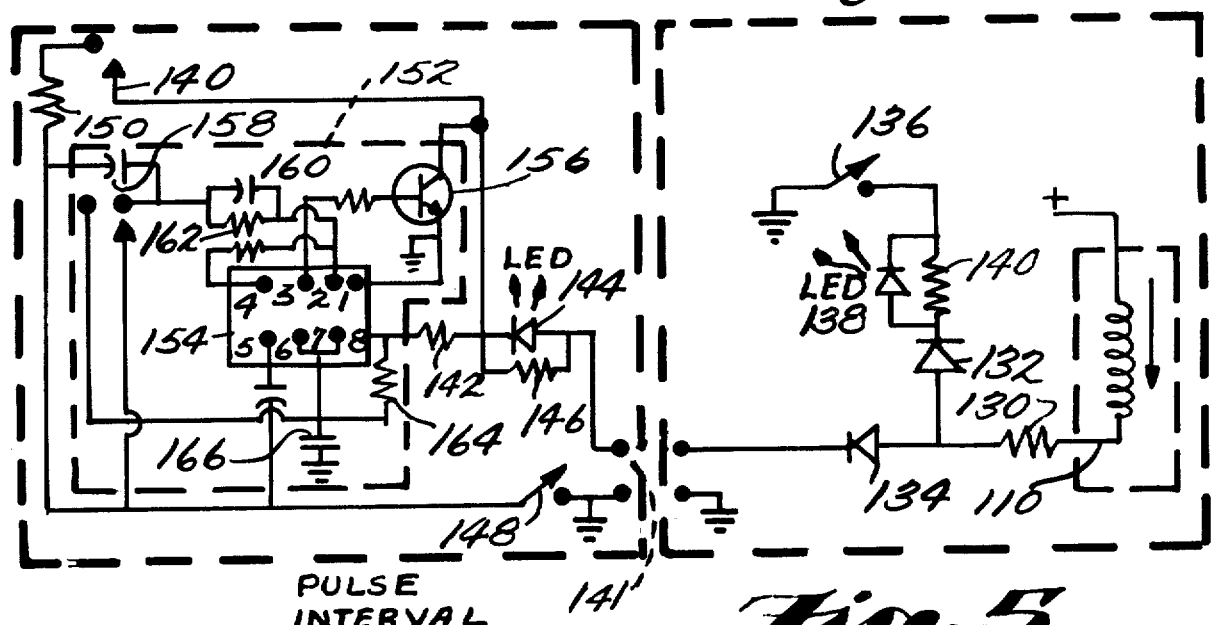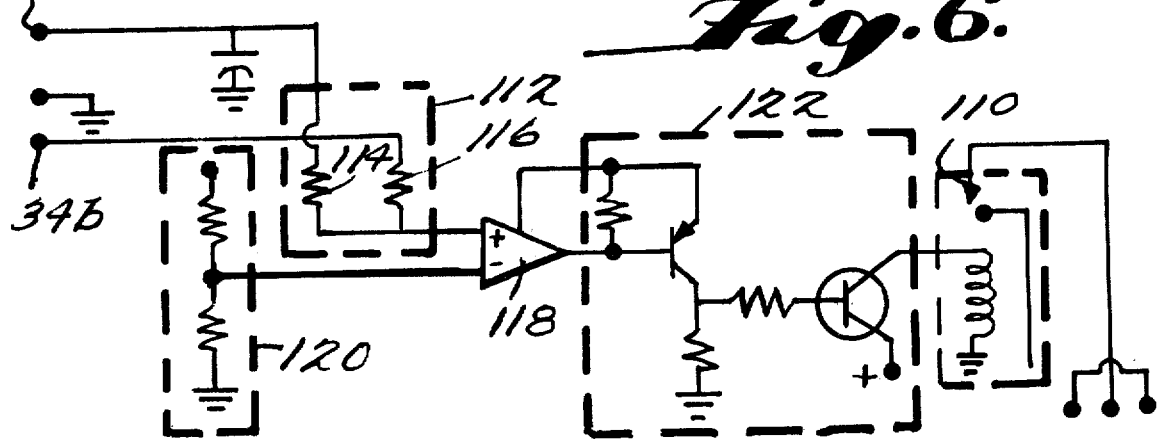

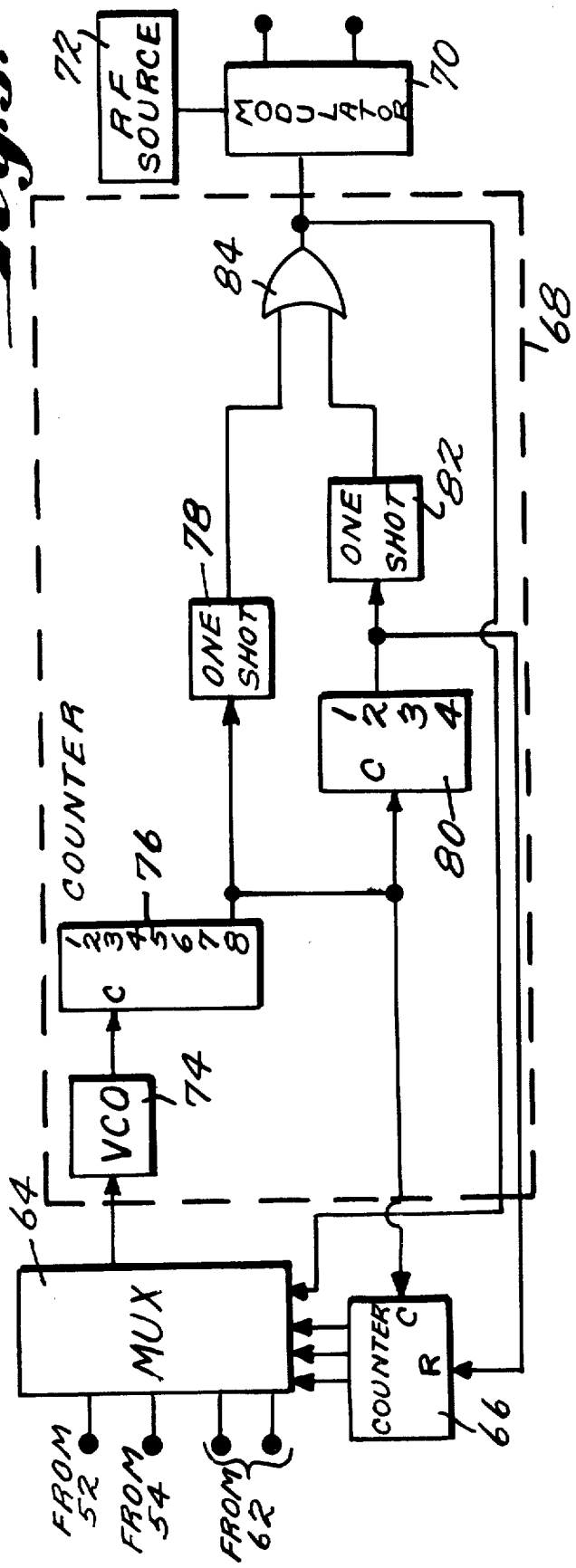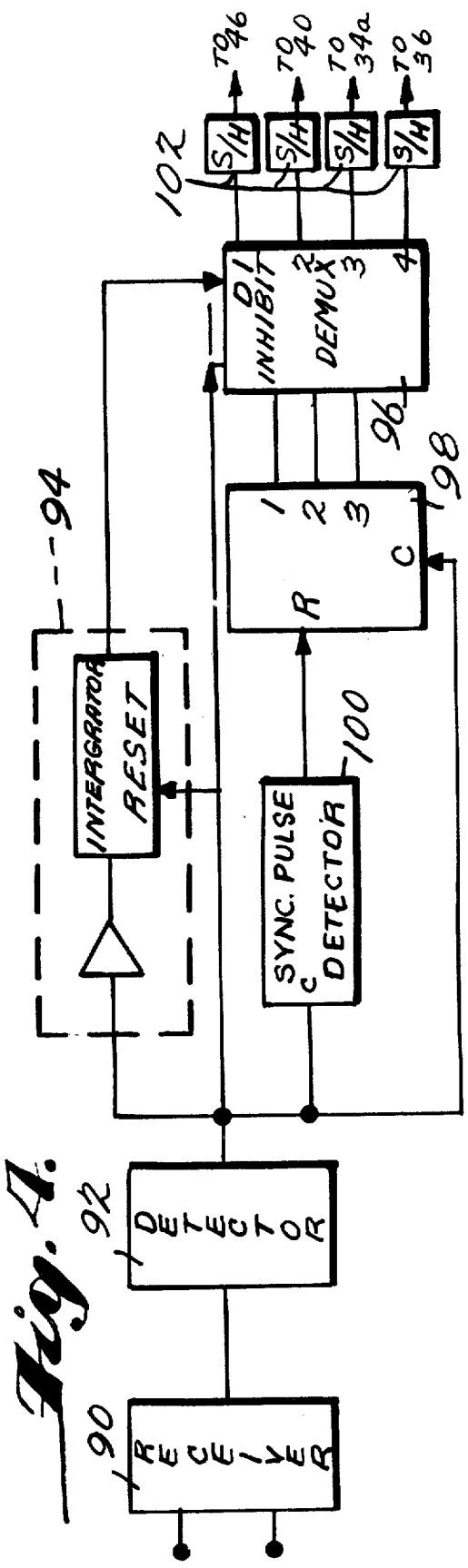

DEVICE FOR REMOTE CONTROL OF STEREO HI-FI AMPLIFIER PARAMETERS

The present invention relates to remote control systems, and more particularly, to a means for remotely controlling a large number of functions such as the controls of volume, balance, treble, bass and on/off in a stereo sound system.

It is often desirable that a stereo sound system include provisions for remote control of the audio parameters of a stereo amplifier or component. For example, a listener may wish to adjust the level, the balance, the treble or the bass parameters of the music to which he is listening without moving from a comfortable position. Also, since sound varies from place to place in a room, it is virtually impossible for a single listener to make adjustments at the amplifier situs to provide for a particular desired sound at a remote listening position. Also, interruptions which occur while listening to the stereo, are more easily handled when full control of the audio parameters is available at the position of the listener. It is further desirable that the remote unit incorporating these features be capable of installation on all types of standard components with a minumum of labor and without requiring changes in the component circuits.

Remote control of audio apparatus is, in general, well known. For example, remote control units for radio receivers are described in U.S. Pat. Nos. 2,206,181 (Gilbert, 1940) and U.S. Pat. No. 2,238,391 (Masters, 1941). Similarly, exemplary remote control units for television receivers are described in U.S. Pat. No. 3,304,502 (Paddock, 1967).

However, prior art methods of remote control for volume and balance parameters have generally required either direct operation on the audio signal at the remote unit, or entailed an undesirable delay in response. Routing of the audio signal to the remote unit, of course, requires use of additional cable, and accordingly, interjects additional signal distortion and attenuation into the system. For example, stray capacitance in the connecting cable tends to cause high frequency loss in the signal. Ultrasonic remote control systems, such as utilized with television receivers, are disadvantageous for use in high fidelity stereo systems in that the sonic frequencies used for control are often present in the audio output of the high fidelity system. Further, ultrasonic remote control systems are limited to operation in the same room or enclosure that the amplifier is located.

The present invention provides for remote control of the audio parameters of the stereo amplifier or component from virtually any distance without interjection of additional loss into the system. The remotely located portion of the control system does not directly operate on the audio output signal and thus facilitates the use of an inexpensive control link between the remote unit and the component where the audio signals are to be modified. In addition, the system provides realtime control from rooms or enclosures other than the room or enclosure of the amplifier situs.

Moreover, the remote control system may be interconnected into the audio system through already existing input and output jacks (in most standard units). Accordingly, the remote control system of the present invention can be utilized in an existing audio system with no modification of the components. More specifically, a control system in accordance with the present invention provides for adjustment of volume, balance, bass and treble parameters of the component and couples into the system through the tape record and tape monitor jacks normally found on stereo system components. It should be appreciated that virtually all quality stereo system components have input and output terminals for responding to the tape record and tape monitor input and output jacks, and accordingly, the present invention is almost universally compatible.

In general, these features are achieved, in accordance with one aspect of the present invention, through utilization of an intermediate circuit disposed proximate to the component, and a remote control panel. The intermediate circuit comprises a plurality of controllable attenuators (variable gain amplifiers). A first controllable attenuator, responsive to volume control signals from the remote panel provides for volume control. A plurality of frequency selective attenuators (active filters) are each coupled to the first attenuator. The frequency selective attenuators are responsive to frequencies corresponding to high frequency range (treble), and low frequency range (bass), respectively, and are responsive in gain to DC control signals applied thereto. Thus, the frequency selective attenuators provide independent control of the bass and treble parameters.

Balance control between respective channels is readily achieved by an adjustable voltage or current divider network in the remote panel. The adjustable voltage or current divider establishes the ratio of control signal amplitudes provided to the volume control attenuators of the respective channels in the system.

The intermediate circuit is disposed proximate to the component, eliminating any appreciable addition to the distance travelled by the audio signals. Thus, the control signals to the active filters may be provided through an inexpensive communications link. For example, the parameter control signals can be provided by standard encoding/multiplexing techniques through ordinary house wiring.

It should be appreciated that such a time multiplexed communication link may be expanded to adapt the system for multi-function control of exceedingly complex audio systems.

BRIEF DESCRIPTION OF THE DRAWING

A preferred exemplary embodiment will hereinafter be described in conjunction with the appended drawing wherein like numerals denote like elements, and:

FIG. 1 is a schematic drawing of an exemplary intermediate circuit in accordance with the present invention;

FIG. 2 is a schematic drawing of an exemplary remote control panel in accordance with the present invention;

FIG. 3 is a block diagram of a suitable multiplexer/encoder;

FIG. 4 is a block diagram of a suitable demultiplexer/decoder;

FIG. 5 illustrates a pulse interval code word;

FIG. 6 is a schematic diagram of a remote control on/off mechanism in accordance with one aspect of the present invention; and FIGS. 7a and 7b are schematic diagrams of a remote control on/off mechanism including automatic timing mechanisms.

DETAILED DESCRIPTION OF A PREFERRED EXEMPLARY EMBODIMENT

Referring now to FIGS. 1 and 2 of the drawing, there is shown a remote control system for control of the bass, treble, volume and balance parameters of signals in an audio system. In accordance with one aspect of the present invention, the remote control system comprises an intermediate active circuit 10 (FIG. 1) cooperating with a remotely disposed control circuit 50 (FIG. 2).

The intermediate active circuit 10 is disposed proximate to the component 12 of the audio system from which the audio signal originates and is functionally interconnected into the system through standard input-/output terminals, prior to the power amplifier of the audio system. The intermediate circuit 10 includes active circuits for controlling the volume, bass, treble and balance parameters of the audio signal in accordance with control signals applied thereto from the remote control panel 50 (FIG. 2).

More specifically, the intermediate circuit 10 of FIG. 1 comprises a plurality of identical channels 10a and 10b corresponding to the respective channels of component 12. The respective channels 10a and 10b are receptive of audio signals from the standard tape recorder output terminals 12a and 12b of the component 12. As is standard in the art, such tape recorder output terminals 12a and 12b, in effect, bypass various of the amplifying stages of the component, and are typically independent of the tone and balance controls associated with the component. The modified signal provided by intermediate circuit 10 is reinserted into the audio system at the standard tape monitor input terminals 14a and 14b of the system power amplifier 14.

Each channel 10a and 10b of intermediate circuit 10 includes an active circuit 16, receptive of the respective audio signal from the corresponding tape recorder output terminal of component 12, for controlling the amplitude of the signal in that channel. The amplified signal from volume control circuit 16 is applied to respective controllable active filters 18 and 20 and to a passive bandpass filter 22, respectively. Active filters 18 and 20 are, in effect, frequency selective controllable attenuators (variable gain amplifiers); active filter 18 responsive to high frequency signals and active filter 20 responsive to low frequencies. Thus, by controlling the relative attenuation (gain) characteristics of active circuits 18 and 20 the treble and bass parameters of the output signal can be selectively varied. The output signals of filters 18, 20 and 22 are, in effect, summed in an amplifier 24, which can also compensate for attenuation of the signal by the filters.

Active amplitude control circuit 16 comprises a conventional differential amplifier 26. The audio signal from component 12 is applied to the non-inverting input of differential amplifier 26 through a limiting resistor 28 and coupling capacitor 30. Resistor 28 operates to attenuate the audio signal to limit distortion in intermediate circuit 10. The inverting input terminal of amplifier 26 has applied, through a trimming potentiometer 32, a DC control signal indicative of the desired signal amplitude in the channel, applied to an input terminal 34 by remote control panel 50 (FIG. 2) as will be explained. Active circuit 16 thus provides an output signal indicative of the audio signal from component 12 but at a AC signal level in accordance with the control signal. Amplifier 16 suitably displays a reverse log amplitude versus attenuation characteristic to compensate for the logarithmic characteristic of the human ear.

The output signal of volume control circuit 16 is applied to active filter 18. As noted above, filter 18 is, in effect, a frequency selective controllable attenuator, and provides for treble parameter adjustments in the audio system. Active filter 18 suitably comprises a passive high pass filter 36 and a conventional differential amplifier 38. The output signals of volume control circuit 16 are applied to passive high pass filter 36. The filtered signals are then applied to the non-inverting input of differential amplifier 38. Treble parameter control signals, from control panel 50 (FIG. 2) are applied at an input terminal 40 and therefrom through a calibration potentiometer 41 to the inverting input of differential amplifier 38 to provide for treble control.

Similarly, the output signals of volume control circuit 16 are applied to active filter 20. Active filter 20 suitably comprises a passive low pass filter 42 and conventional differential amplifier 44. Low pass filter 42 operates on the signals of volume control circuit 16. The filtered signals are then applied to the non-inverting input of differential amplifier 44. Bass parameter control is provided by application of a bass control signal generated by the remote control panel 50 (FIG. 2), as will be explained, to an input terminal 46 and therefrom through a calibration potentiometer 47 to the inverting input of amplifier 44.

Bandpass filter 22 suitably is a passive network comprising serially connected capacitor 48 and resistor 49. The values of capacitor 48 and resistor 49 are chosen to provide a pass band corresponding to the midband of the system audio response. Calibration potentiometers 41 and 47, respectively, are suitably adjusted such that the output signals of active filters 18 and 20 correspond to the output of bandpass filter 22 at midband of the balance adjustment (no enhancement or repression of bass or treble components). In other words, the system is calibrated such that when bass and treble are equally balanced, each of the filters 18, 20 and 22 provide an identical output.

Amplifier 24, in effect, operates as a summing amplifier with respect to the signals of filters 18, 20 and 22, generating an amplified composite output signal. Amplifier 24 is suitably a conventional preamplifier formed from a differential amplifier and receptive of signals from a common node to which the output signals of each of filters 18, 20 and 22 are applied. The circuit parameters of amplifier 24 are suitably chosen to obtain low noise characteristics and to provide a gain to compensate for attenuation of the audio signal by the respective components of intermediate circuit channel (10a).

Referring now to FIG. 2, the remotely disposed control circuit panel 50 for generating balance, volume, ball and treble parameter control signals to intermediate circuit 10 may be any suitable device for generating signals with levels or amplitudes in accordance with a desired parameter value. For example, DC treble and bass control signals may be generated at the wiper arms of potentiometers 52 and 54, connected with the resistive elements thereof coupled in parallel between a positive potential (or current source) and ground potential. Similarly, a potentiometer 56 coupled between a voltage (or current) source and ground can be utilized to provide a DC signal indicative of desired volume level. A muting feature, as commonly used in standard audio systems, may be provided by selectively coupling a further resistor 58 between potentiometer 56 and ground. This may easily be effected through a standard single pole double or single throw switch 60. The wiper of potentiometer 56 is electrically coupled to the wiper of a balance potentiometer 64. Balance potentiometer 62 operates to divide the control voltage (or current) provided by volume potentiometer 56 between the respective channels 10a and 10b of intermediate circuit 10 in accordance with a desired ratio.

Potentiometers 52, 54 and 62 are suitably linear taper potentiometers, while potentiometer 56 is preferably a reverse log taper potentiometer. A reverse log taper in potentiometer 56 conforms to the attenuation characteristic of volume control circuit 16 and thus provides a more convenient tuning characteristic.

The wiper settings of bass potentiometer 52 and treble potentiometer 54 establish the control signal levels to the respective differential amplifiers 38 and 44 of active high pass filter 18 and active low pass filter 20. Thus, the attenuation of the audio signal frequency components corresponding to bass frequencies and treble frequencies are independently controlled at control panel 50.

The wiper setting of voltage potentiometer 56 establishes the overall volume of the system, while the wiper setting of balance potentiometer 62 establishes the relative volumes in the respective channels. The signals generated at the respective terminals of the resistive element of potentiometer 62 are applied to the respective volume control terminals 34a and 36b of the respective channels.

The control voltages from control panel 50 may be communicated to intermediate circuit 10 by any suitable communications link. For example, a direct connection can be made with inexpensive conductive wire between the wiper arms of potentiometers 52 and 54 and terminals 40 and 46, respectively, and between the appropriate resistive element terminal of balance potentiometer 62 and the control volume input terminals 34a and 34b. It should be noted that, the bass and treble control signals from potentiometers 52 and 54 can be applied to both terminals 40a and 40b and 46a and 46b to maintain equivalent tone control in the respective channels. Alternatively, separate bass and treble control potentiometers can be included for each channel.

Communication between control panel 50 and intermediate circuit 10 can be effected through a single wire by standard encoding and multiplexing techniques. Such multiplexing and encoding techniques facilitate connection between control panel 50 and intermediate circuit 10 through ordinary house electrical wiring.

An exemplary multiplexed communication link is shown in FIGS. 3 and 4. A time division multiplexed encoder (FIG. 3) is included in control panel 50. The multiplexing encoder translates the control signals into a code form compatible with the communication medium utilized and transmits the coded signals over the medium. A suitable multiplexing decoder (FIG. 4) is included at the situs of intermediate circuit 10, receiving the encoded multiplexed signals and generating therefrom control signals for selective application to terminals 34, 40 and 46 of intermediate unit 10.

Referring now to FIG. 3, the respective control signals from potentiometers 52, 54 and 62 are applied to the respective input terminals of a conventional multiplex switch 64. Multiplex switch 64 selectively couples the respective control signals to the switch output terminal in accordance with a digital control code applied thereto. The control code is generated by a counter 66.

The multiplexed signal is applied to a suitable encoder 68, to develop an encoded signal. The encoded signal is applied to a conventional modulator 70, also receptive of an RF carrier signal from a conventional RF source 72. Modulator 70 transmits the code signals over the selected communication medium. In the instant example, standard house electrical wiring is utilized as the communication medium. The coded signals are applied through a standard line cord (through which electrical power is derived for remote panel 50) to the house wiring.

Encoder 68 is suitably a pulse interval encoder, which represents the DC voltage parameter control levels as the time interval between pulses. A four byte pulse interval code sampling frame is shown in FIG. 5. As is well known in the art, such an encoder may be formed of a voltage controlled oscillator (VCO), counters, and conventional one-shot circuits. The output of multiplexer 64 is applied as a control voltage to the voltage controlled oscillator (74), which, in turn, provides a clock signal to increment a counter 76. Counter 76 generates an output signal after a predetermined number of cycles (e.g., 256) of the VCO (74) output signal. The counter output signal is applied as a trigger pulse to a conventional one-shot 78 and as a clock signal to counter 66. Thus, the time intervals between the generation of signals by one-shot 78 are indicative of the frequency of the VCO output signal, which is, in turn, indicative of the instantaneous DC voltage level of the multiplexer output signal. Thus, pulse interval encoding is provided. The output signal 78a (hereinafter referred to as a data pulse) is shown in FIG. 5.

A sync signal is provided by incrementing another counter 80 in accordance with each signal generated by counter 76. Counter 80, in effect, counts the number of intervals (data pulses) and generates an output signal indicating that each of the control signals has been represented, i.e., the sampling frame is complete. The output signal of counter 80 is therefore utilized to reset counter 66 and to trigger a further one-shot 82. The output pulse (hereinafter sync pulse 82a) of one-shot 82 is shown in FIG. 5 in timed relation with data pulse 78a. One-shot 82 preferably generates a sync pulse 82a having a duration significantly greater than the pulse duration of the data pulse 78a from one-shot 78 to provide for discrimination between data and sync pulses. The output signals of one-shots 78 and 82 are applied to a conventional OR gate 84, the output signal of which is applied to modulator 70 to effectively gate the transmission of the carrier signal. The code signal thus takes the form of a train of pulses (bursts of carrier) at intervals in accordance with the respective control voltages. If desired, multiplexer 64 can be inhibited during the generation of pulses by one-shots 78 and 82, by also coupling the output signals OR gate 84 to an inhibit terminal on the multiplexer chip.

The pulse train is then applied to the ordinary house wiring, suitably through the line cord through which remote unit 50 draws its power (conventional rectifier circuitry utilized to generate DC voltages in the remote unit is not shown). If desired, synchronization can be provided between the 60 cycle electrical power signal on the house wiring and the information signal by providing an additional counter (not shown) which generates a signal to reset counter 66 upon detecting a predetermined number of cycles of the 60 Hz signal.

At the situs of intermediate circuit 10, a receiver is coupled to the power line and extracts the information signal therefrom. The decoder/demultiplexer then generates respective DC signals in accordance with demultiplexed code. More specifically, a conventional receiver 90, tuned to the carrier frequency extracts the carrier frequency signals from the power line. The extracted code signals are then applied to a suitable demodulator/detector 92, which develops a signal substantially identical to the pulse interval code generated by encoder 68.

The code signals are applied to a suitable decoder 94, such as an inverter serially coupled to a resettable integrator. The integrator charges at a constant rate during the information periods between pulses in the code signals and thus develops a DC voltage indicative of the period between the pulses. The integrator is reset in response to each positive going transition in the code signal to enable decoding of the next byte of information.

Demultiplexing is accomplished through use of a conventional demultiplexing switch 96 cooperating with a counter 98, a sync pulse detector 100 and a plurality of conventional sample and hold circuits generally indicated at 102. Sync pulse detector 100 discriminates between the shorter duration data pulses in the code word and the longer duration sync pulses separating respective sampling frames. Counter 98 is incremented in response to each negative going transition in the code word, to cause demultiplexing switch 96 to selectively couple the DC voltage developed by decoder 94 to a particular sample and hold circuit 102. Counter 98 is reset in response to signals generated by sync pulse detector 100 upon detecting a sync pulse. Sample and hold circuits 102 are respectively coupled to input terminals 46, 30, 34a and 34b of intermediate circuit 10. Sample and hold circuits 102 provide a steady control voltage level to intermediate circuit 10, which is updated each sampling period.

It should be appreciated that the above-described time division multiplexing is particularly useful for multifunction control. The only limitations upon the number of controls that can be accommodated are modulation bandwidth and sampling rate constraints. It should be appreciated that the bandwidth of the system can be increased to provide for remote control selection of all FM, AM and TV channels as well as volume, balance, bass and tone, and on/off control (as will be explained).

A multiplexed remote control system is particularly advantageous for remote control of an audio system having a multiplicity of microphones or other inputs, such as are often used, in recording or mixing live music concerts. In that application, the communications link between control panel and respective intermediate circuit 10 may preferably comprise a single or dual channel full audio bandwidth transmitter/receiver to provide for monitoring any given channel at the location of the microphone or other input.

It should also be appreciated that other coding systems may be advantageously employed. For example, encoder 68 may comprise an analog-to-digital converter and shift register for providing a standard pulse code modulation signal. Of course, a compatible decoder 94 would be utilized at intermediate circuit 10. Similarly, frequency shift keying can be employed. Further, it should also be appreciated that frequency multiplexing, wherein each control signal is accorded a separate frequency carrier, may be utilized.

In accordance with another aspect of the present invention, remote on/off control may be provided at control panel 50. Remote on/off control can, in fact, be provided without addition of a further control signal or additional link between remote control panel 50 and intermediate circuit 10. An example of a circuit for effecting remote on/off control is shown in FIG. 6. In practice, intermediate circuit 10 would be plugged into a house outlet through a conventional line cord, and would include an outlet into which the line cord plug of component 12 (and any other components for which remote on/off control are desired) is inserted. A normally off relay 110, selectively couples the power to the outlet into which component 12 is plugged. Relay 110 may also be utilized to control application of power to various portions of intermediate circuit 10, if desired.

The control current for relay 110 is suitably developed from the volume control signals applied to terminals 34a and 34b of the respective channels of circuit 10. The respective control voltages are effectively summed by a passive summer 112. Summer 112 suitably comprises high impedance resistors 114 and 116 to prevent loading of intermediate circuit 10. The sum signal is then applied to the non-inverting input of a conventional differential amplifier 118. A predetermined threshold voltage, suitably developed by a passive voltage divider network 120, is applied to the inverting input of amplifier 118. The output signal of differential amplifier 118 is applied to suitable driving circuitry 122, which operates to selectively provide the activating current to relay 110, in accordance with the output of amplifier 118. In the preferred embodiment, the attenuation characteristics of the controllable attenuator 26 (variable gain amplifier) is such that volume varies inversely with volume control voltage. When the sum of the volume control voltages applied to the respective channels of intermediate circuit 110 is less than the reference threshold value established by voltage divider 120, driver circuit 122 is, in effect, turned on. The activating current is therefor applied to relay 110 and power is applied to component 12. However, when the sum of the volume control voltages rises above the threshold value, driver circuit 122 is inhibited, relay 110 de-energized, and the connection to the power line broken. Thus, remote on/off control of component 12 can be effected without addition of further control links between control panel 50 and intermediate circuit 10.

If desired, a short delay (e.g., 10 sec.) can be interjected into the circuit between amplifier 118 and driving circuitry 122. The delay (not shown) eliminates spurious turning off of component 12 during volume adjustments.

A remote on/off control system including an automatic timer provision may be provided as an alternative to the circuit of FIG. 6. Such a circuit is shown in FIGS. 7a and 7b. The circuit of FIG. 7, however, requires additional circuitry in control panel 50 (shown in FIG. 7a) as well as additional circuitry in intermediate circuit 10 (shown in FIG. 7b). In addition, a direct connection between the associated circuitry in control panel 50 and intermediate circuit 10 is required in the particular embodiment shown.

Referring now to FIGS. 7a and 7b, the activation coil of relay 110 is coupled at one terminal to a positive voltage source. The other terminal of the relay coil is coupled through a resistor 130 and blocking diodes 132 and 134 to a manually operated switch 136 and to a conductor 141 linking the circuit to control panel 50.

Switch 136 operates to selectively provide a current path to ground for the coil of relay 110, thus providing for manual operation. An LED 138 may be provided, in cooperation with a resistor 140 to produce a visual indicia of the manual connection.

As noted above, the activation coil of relay 110 is also, in effect, connected through resistor 130 and blocking diode 134 to remote control panel 50. The associated circuitry of remote panel 50 is shown in FIG. 7a. The anode of diode 134 is connected via the linking conductor 141 to one terminal of switch 140, and to a resistor 142. The other terminal of switch 140 is connected through a resistor 150 to one terminal of an on/off control switch 148 and to a conventional timing circuit 152. The other terminal of switch 148 is connected to ground potential. If desired, an indicator LED 144 and associated resistor 146 may be connected between conductor 141 and the juncture of the switch 140 and resistor 142.

In operation, switch 140 is utilized to select between timed and untimed remote control operational modes. When switch 140 is closed, a current path is provided for the coil of relay 110 through switch 140, resistor 150 and switch 148 to ground. Thus, when switch 140 is closed, relay 110 may be selectively activated or deactivated through operation of switch 148. When switch 140 is open, however, closing switch 148 causes application of a trigger pulse to timing circuit 152.

The timing circuit 152 suitably comprises, for example, a conventional integrated circuit (IC) timer 154 such as a Signetics NE/SE555 monolithic timing circuit and associated circuitry. Timing circuit 152 suitably provides control voltages to a transistor 156 which selectively provides a current path to ground (pin 1 of the IC for the activation coil of relay 110). Thus, relay 110 may be activated for a predetermined period to provide a timed on/off control for component 12. Switch 148 is suitably coupled to the trigger input terminal of IC 154 through a capacitor 158 serially connected to a parallel combination of capacitor 160 and resistor 162. Capacitor 158 operates to prevent noise from triggering IC timer 154. The timer operational period is controlled through resistor 142, and a resistor 164 and capacitor 166, serially connected between the control voltage terminal (5) of the IC to ground. The juncture of resistor 164 and capacitor 166 is coupled to the threshold (6) and discharge (7) terminals of the IC. Thus, when the on/off switch 148 is closed, a pulse is generated to trigger IC timer 154, effecting generation of a voltage to turn on transistor 156. Thus, a current path is completed to energize relay 110. At the end of the predetermined period, for example 20 minutes, determined by resistors 142, 164 and capacitor 166, IC timer 154 times out, turning off transistor 156. Thus, at the end of the predetermined period the current path for relay 110 is broken and the relay de-energized. It should be appreciated that other types of timing circuits can be used. Further, provisions for varying the operational period of the timer may be included.

A further on/off control may be provided by monitoring the level of the audio signals. When the audio signal level remains below a preset threshold for longer than a predetermined period, a relay can be tripped to shut off power to the component. For example, this can be accomplished by a circuit similar to that shown in FIG. 6. The audio signals at terminals 12a and 12b would be rectified and applied to passive summer 116. A conventional delay device or timer circuit would be interjected between amplifier 118 and driving circuit 112. The period of the delay (e.g., 5 minutes) is chosen to be longer than any normally encountered absence of audio signal, such as that occurring during a change of records on a turntable.

In addition, a plurality of components can be selectively coupled to amplifier 14 by intermediate circuit 10. For example, the audio signals from the respective components can be selectively coupled to intermediate circuit 10 at volume control circuit 16 through suitable relay devices. The relay devices may be controlled, if desired, in the manner of a further audio parameter. The relay devices may also be controlled by automatic or timed shut off signals such as that generated by the above noted 5 minute delay. In this manner, for example, a record player, coupled to the intermediate circuit 10 through an activated relay, can be automatically shut off in the evening, and a radio tuner coupled to the intermediate circuit 10 for remotely controlled use in the morning.

It will be understood that the term "controlled attenuator" as used herein encompasses variable gain amplifiers with positive gains. Further, the above description is of illustrative embodiments of the present invention and the invention is not limited to the specific form shown. As noted, any suitable communications link between the control panel and intermediate circuit may be utilized. Similarly, any suitable encoding/decoding scheme may be utilized. These and other modifications can be made in the design and arrangement of the elements as will be apparent to those skilled in the art, without departing from the scope of the invention as expressed in the appended claims.

What is claimed is:

1. Apparatus for remote control of audio signal parameters in an audio system an audio signal processing component for generating and amplifying said audio signal, said component having at least one record output terminal through which said audio signal is passed prior to final amplification and at least one corresponding record input terminal from which audio signals are passed to final amplification in said component, said apparatus comprising:

a remote control circuit for generating parameter control signals indicative of desired values of said parameters;

intermediate circuit means responsive to said parameter control signals and adapted for electrical connection between said component record output and input terminals for generating a modified audio signal input to said record input terminal having parameters in accordance with said parameter control signals; and means for communicating said parameter control signals from said remote control circuit to said intermediate circuit.

2. The apparatus of claim 1 wherein said intermediate circuit means includes means for selectively modifying the volume, bass and treble parameters of said audio signal.

3. Apparatus for remote control of parameters of an audio signal within an audio signal processing component including final amplification in an audio system, said apparatus comprising:

a remote control circuit for generating parameter control signals indicative of desired parameter values;

an intermediate circuit connected to intercept an audio signal within said component prior to said final amplification, said intermediate circuit being responsive to said audio signal and to said parameter signal for selectively modifying the volume, bass and treble parameters of said audio signal in accordance with said parameter control signals; and said modified audio signal from the intermediate circuit being connected for said final amplification;

means for communicating said parameter control signals from said remote control circuit to said intermediate circuit.

4. The apparatus of claims 1 or 3 wherein said audio system has a plurality of channels and said intermediate circuit includes separate channels corresponding to the respective channels of said audio system.

5. The apparatus of claim 4 wherein: each channel of said intermediate circuit includes a controllable attenuator for volume control, said controllable attenuator attenuating said audio signal in accordance with volume parameter control signals applied thereto, and said intermediate circuit further comprises:

relay means, responsive to actuation signals applied thereto, for selectively energizing output terminals adapted for connection to said component;

means for generating a sum signal indicative of the sum of the magnitudes of the volume parameter control signals applied to the respective channels of said intermediate circuit; and comparator means for selectively generating said actuation signal to said relay means in accordance with the comparison of the magnitudes of said sum signal to a predetermined threshold value.

6. The apparatus of claims 2 or 3 wherein said means for selectively modifying the volume of said audio signal comprises a controllable attenuator responsive to said audio signal and volume parameter control signals applied thereto for attenuating said audio signal in accordance with said volume parameter control signals.

7. The apparatus of claim 6 wherein said intermediate circuit further comprises an on/off control mechanism including:

relay means, responsive to activation signals applied thereto, for selectively applying power to said component;

driver means, for selectively generating said activation signals to said relay means; and comparator means, responsive to volume parameter control signal for inhibiting said driver means when the magnitude of said volume control signals is less than a predetermined threshold value.

8. The apparatus of claims 2 or 3 wherein said means for selectively modifying the bass and treble parameters of said audio signal comprises:

frequency selective attenuator means, responsive to bass and treble parameter control signals applied thereto, for independently attenuating the bass and treble frequency components of said audio signal by respective amounts in accordance with said bass and treble parameter control signals.

9. The apparatus of claim 8 wherein said frequency selective attenuator means comprises:

a low pass filter, responsive to said audio signal, for passing only components of said audio signal having frequencies corresponding to bass frequencies;

a high pass filter, responsive to said audio signal for passing only components of said audio signal having frequencies corresponding to treble frequencies;

a bandpass filter for passing components of said audio signal having frequencies corresponding to a predetermined middle range of frequencies;

first and second controllable attenuators, coupled to said low pass filter and high pass filter, respectively, and respectively responsive to said bass and treble parameter control signals; and a summing amplifier responsive to signals from said first and second controllable attenuators and said bandpass filter.

10. The apparatus of claims 2 or 3 wherein said remote control panel comprises:

first, second and third adjustable voltage divider networks respectively associated with bass, treble and volume parameters for generating the control indicative of desired bass, treble and volume parameter levels.

11. The apparatus of claim 10 wherein said audio system has a plurality of channels and said intermediate circuit includes respective channels corresponding to said system channels and said remote control panel includes:

further adjustable voltage divider means, responsive to signals from the adjustable voltage divider means associated with the volume parameter, for generating volume parameter control signals to said respective intermediate circuit channels having relative amplitudes in accordance with a desired balance ratio.

12. The apparatus of claims 1, 2 or 3 wherein said means for communicating comprises:

multiplexing means disposed proximate to said remote control panel for selectively sampling said parameter control signals and sequentially transmitting signals indicative of said control signal samples to said intermediate circuit; and demultiplexing means, disposed proximate to said intermediate circuit and receptive of said transmitted signals, for reconstituting said respective parameter control signals and applying said parameter control signals to said intermediate circuit.

13. The apparatus of claim 12 wherein said multiplexing means comprises:

a multiplexing switch for selectively applying one of said respective parameter control signals to an output terminal thereof in accordance with a multiplex control code applied thereto;

a multiplex counter, responsive to incrementing and reset control signals applied thereto, for generating said multiplex control code to said multiplexing switch;

pulse interval encoding means for generating data pulses of a first predetermined duration at intervals in accordance with the magnitude of the respective parameter control signals applied at said multiplex switch output terminal and for generating a corresponding increment control signal to said multiplex counter;

synchronization encoding means responsive to said increment control signals, for generating a sync pulse of a second predetermined duration after pulse intervals have been effected indicative of each of said respective parameter control signals and for generating a corresponding reset signal to said multiplex counter; and means, responsive to said data and sync pulses and a carrier signal applied thereto for amplitude modulating said carrier signal in accordance with said pulses; and wherein further said demultiplexing means comprises:

a demodulator for generating an output signal representative of said data pulses and sync pulses; and integrator means, responsive to said demodulator output signal, for generating DC signal levels in accordance with the time intervals between successive data pulses;

a demultiplexing switch responsive to said integrator DC levels and a demultiplex control code applied thereto, for applying said DC level to a respective output terminal thereof associated with a particular parameter control signal in accordance with said demultiplex control code;

a demultiplex counter, incremented in response to said data pulses and responsive to a demultiplex counter reset signal applied thereto for generating said demultiplex control code;

sync pulse detector means, responsive to said demodulator output signal, for generating said demultiplex counter reset signal upon detection of a sync pulse in said demodulator output signal; and a plurality of sample and hold circuits, respectively coupled to said demultiplexing switch output terminals for providing continuous DC signals to said intermediate circuit representative of said respective parameter control signals.

14. The apparatus of claims 1, 2 or 3 wherein:

said intermediate circuit includes relay means, responsive to activation signals applied thereto for selectively applying power to said component; and said remote control panel includes timing means, for effecting generation of said activation signals for a predetermined time period.

15. Apparatus for providing remote control of parameters of an audio signal generated by a component in an audio system, said audio system comprising said component and an amplifier, said apparatus comprising:

an intermediate circuit interposed between said component and said amplifier, and a remote control panel for generating control signals to said intermediate circuit, said intermediate circuit including:

first controllable attenuator means, responsive to said audio signal and a volume control signal from said remote panel applied thereto for controllably attenuating said audio signal in accordance with said volume control signal to provide volume control of said audio signal;

first and second frequency selective attenuators, responsive to said attenuated audio signal and bass and treble control signals respectively applied thereto, for controllably attenuating specified frequency components of said audio signal in accordance with said bass and treble control signals; and means for combining the output signals of said frequency selective attenuators to generate an output signal, said output signal being applied as an input signal to said amplifier.

16. Apparatus for providing remote control of audio signal parameters in an audio system, said system comprising a component for generating said audio signal, and an amplifier, said component providing an audio signal suitable as an input to a standard tape recorder at tape recorder output terminals associated therewith, said apparatus comprising:

a remote control panel for generating parameter control signals indicative of desired values of said parameters;

intermediate circuit means, adapted for electrical connection to said component tape recorder output terminals and responsive to said parameter control signals, for generating a modified audio signal having parameters in accordance with said parameter control signals, said modified audio signal being applied to said amplifier;

means for communicating said parameter control signals from said remote control panel to said intermediate circuit;

said audio system having a plurality of channels and said intermediate circuit including separate channels corresponding to the respective channels of said audio system;

each channel of said intermediate circuit including a controllable attenuator for volume control, said controllable attenuator attenuating said audio signal in accordance with volume parameter control signals applied thereto, and said intermediate circuit further comprising:

relay means, responsive to actuation signals applied thereto, for selectively energizing output terminals adapted for connection to said component;

means for generating a sum signal indicative of the sum of the magnitudes of the volume parameter control signals applied to the respective channels of said intermediate circuit, and comparator means for selectively generating said actuation signal to said relay means in accordance with the comparison of the magnitudes of said sum signal to a predetermined threshold value.

17. Apparatus for providing remote control of parameters of an audio signal generated by a component in an audio system, said apparatus comprising:

a remote control panel for generating parameter control signals indicative of desired parameter values;

an intermediate circuit, responsive to said audio signal and to said parameter signals, for selectively modifying the volume, bass and treble parameters of said audio signal in accordance with said parameter control signals; and means for communicating said parameter control signals from said remote control panel to said intermediate circuit;

said audio system having a plurality of channels and said intermediate circuit including separate channels corresponding to the respective channels of said audio system;

each channel of said intermediate circuit including a controllable attenuator for volume control, said controllable attenuator attenuating said audio signal in accordance with volume parameter control signals applied thereto, and said intermediate circuit further comprising:

relay means, responsive to actuation signals applied thereto, for selectively energizing output terminals adapted for connection to said component;

means for generating a sum signal indicative of the sum of the magnitudes of the volume parameter control signals applied to the respective channels of said intermediate circuit; and comparator means for selectively generating said actuation signal to said relay means in accordance with the comparison of the magnitudes of said sum signal to a predetermined threshold value.

* * * * *